(12) United States Patent
Gentleman et al.

(10) Patent No.: US 8,236,432 B2
(45) Date of Patent: *Aug. 7, 2012

(54) WETTING RESISTANT MATERIALS AND ARTICLES MADE THEREWITH

(75) Inventors: Molly Maureen Gentleman, College Station, TX (US); James Anthony Ruud, Delmar, NY (US); Mohan Manoharan, Bangalore (IN)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/970,647

(22) Filed: Dec. 16, 2010

(65) Prior Publication Data

US 2011/0083736 A1    Apr. 14, 2011

Related U.S. Application Data

(62) Division of application No. 12/562,599, filed on Sep. 18, 2009, now Pat. No. 7,901,798.

(51) Int. Cl.
*C23C 14/00* (2006.01)
*B32B 9/00* (2006.01)
*B23B 3/26* (2006.01)
*C01F 17/00* (2006.01)

(52) U.S. Cl. ............ 428/697; 428/457; 428/312.8; 428/701; 428/702; 428/913; 423/263

(58) Field of Classification Search ............ None
See application file for complete search history.

(56) References Cited

U.S. PATENT DOCUMENTS

| 4,151,123 A * | 4/1979 | McCann, III ............ 502/303 |
| 6,117,560 A | 9/2000 | Maloney |
| 6,177,200 B1 | 1/2001 | Maloney |
| 6,231,991 B1 | 5/2001 | Maloney |
| 6,319,614 B1 | 11/2001 | Beele |
| 6,387,526 B1 | 5/2002 | Beele |
| 6,730,422 B2 | 5/2004 | Litton et al. |

(Continued)

FOREIGN PATENT DOCUMENTS

JP   2004091271   3/2004

OTHER PUBLICATIONS

Flanigen et al., "Silicalite, A New Hydrophobic Crystalline Silica Molecular Sieve", Nature, vol. 271, pp. 512-516, Feb. 9, 1978.

(Continued)

*Primary Examiner* — Ling Xu
(74) *Attorney, Agent, or Firm* — Paul J. DiConza (57) ABSTRACT

Ceramic materials with relatively high resistance to wetting by various liquids, such as water, are presented, along with articles made with these materials, methods for making these articles and materials, and methods for protecting articles using coatings made from these materials. One particular embodiment is an article that comprises a coating having a surface connected porosity content of up to about 5 percent by volume. The coating comprises a material that comprises a primary oxide and a secondary oxide, wherein (i) the primary oxide comprises a cerium cation, and (ii) the secondary oxide comprises a cation selected from the group consisting of the praseodymium and neodymium. The material is transparent to electromagnetic radiation of at least one type selected from the group consisting of ultraviolet radiation, visible light, and infrared radiation.

18 Claims, 6 Drawing Sheets

U.S. PATENT DOCUMENTS

| | | |
|---|---|---|
| 6,835,465 B2 | 12/2004 | Allen et al. |
| 6,924,040 B2 | 8/2005 | Maloney |
| 2002/0028344 A1 | 3/2002 | Beele |
| 2003/0049470 A1 | 3/2003 | Maloney |
| 2004/0101699 A1 | 5/2004 | Vassen et al. |
| 2007/0028588 A1 | 2/2007 | Varanasi et al. |
| 2007/0031639 A1 | 2/2007 | Hsu et al. |

OTHER PUBLICATIONS

Cao et al., "Lanthanum-Cerium Oxide as a Thermal Barrier-Coating Material for High-Temperature Applications", Advanced Materials, vol. 15, No. 17, pp. 1438-1442, Sep. 3, 2003.

Co-pending US Patent Application entitled "Surfaces and Articles Resistant to Impacting Liquids", U.S. Appl. No. 11/487,023, filed on Jul. 17, 2006.

Co-pending US Patent Application entitled "Wetting Resistant Materials and Articles Made Therewith", U.S. Appl. No. 12/340,783, filed on Dec. 22, 2008.

Co-pending US Patent Application entitled "Wetting Resistant Materials and Articles Made Therewith", U.S. Appl. No. 12/340,785, filed on Dec. 22, 2008.

Co-pending US Patent Application entitled "Wetting Resistant Materials and Articles Made Therewith", U.S. Appl. No. 12/550,499, filed on Aug. 31, 2009.

Co-pending US Patent Application entitled "Wetting Resistant Materials and Articles Made Therewith", U.S. Appl. No. 12/349,228, filed on Jan. 6, 2009.

\* cited by examiner

WETTING RESISTANT MATERIALS AND ARTICLES MADE THEREWITH

CROSS-REFERENCE TO RELATED APPLICATIONS

This application is a divisional of U.S. patent application Ser. No. 12/562,599, filed 18 Sep. 2009, which is a continuation in part of U.S. patent application Ser. No. 11/958,453, filed Dec. 18, 2007; both of these are herein incorporated by reference.

BACKGROUND

This invention relates to wetting resistant materials. More particularly, this invention relates to articles that include coatings of wetting resistant materials.

The "liquid wettability", or "wettability," of a solid surface is determined by observing the nature of the interaction occurring between the surface and a drop of a given liquid disposed on the surface. A high degree of wetting results in a relatively low solid-liquid contact angle and large areas of liquid-solid contact; this state is desirable in applications where a considerable amount of interaction between the two surfaces is beneficial, such as, for example, adhesive and coating applications. By way of example, so-called "hydrophilic" materials have relatively high wettability in the presence of water, resulting in a high degree of "sheeting" of the water over the solid surface. Conversely, for applications requiring low solid-liquid interaction, the wettability is generally kept as low as possible in order to promote the formation of liquid drops having high contact angle and thus minimal contact area with the solid surface. "Hydrophobic" materials have relatively low water wettability (contact angle generally at or above 90 degrees); so-called "superhydrophobic" materials (often described as having a contact angle greater than 120 degrees) have even lower water wettability, where the liquid forms nearly spherical drops that in many cases easily roll off of the surface at the slightest disturbance.

Heat transfer equipment, such as condensers, provide one example of an application where the maintenance of surface water as droplets rather than as a film is important. Two alternate mechanisms may govern a condensation process. In most cases, the condensing liquid ("condensate") forms a film covering the entire surface; this mechanism is known as filmwise condensation. The film provides a considerable resistance to heat transfer between the vapor and the surface, and this resistance increases as the film thickness increases. In other cases, the condensate forms as drops on the surface, which grow on the surface, coalesce with other drops, and are shed from the surface under the action of gravity or aerodynamic forces, leaving freshly exposed surface upon which new drops may form. This so-called "dropwise" condensation results in considerably higher heat transfer rates than filmwise condensation, but dropwise condensation is generally an unstable condition that often becomes replaced by filmwise condensation over time. Efforts to stabilize and promote dropwise condensation over filmwise condensation as a heat transfer mechanism in practical systems have often required the incorporation of additives to the condensing medium to reduce the tendency of the condensate to wet (i.e., form a film on) the surface, or the use of low-surface energy polymer films applied to the surface to reduce film formation. These approaches have drawbacks in that the use of additives may not be practical in many applications, and the use of polymer films may insert significant thermal resistance between the surface and the vapor. Polymer films may also suffer from low adhesion and durability in many aggressive industrial environments.

Texturing or roughening the surface can change the contact angle of water on a surface. A texture that increases the tortuosity of the surface but maintains the contact between water droplet and the surface will increase the contact angle of a hydrophobic material and decrease the contact angel of a hydrophilic material. In contrast, if a texture is imparted that maintains regions of air beneath a water droplet, the surface will become more hydrophobic. Even an intrinsically hydrophilic surface can exhibit hydrophobic behavior if the surface is textured to maintain a sufficiently high fraction of air beneath the water drop. However, for applications requiring highly hydrophobic or superhydrophobic behavior, it is generally more desirable in practice to texture a hydrophobic surface than to texture a hydrophilic surface. An intrinsically hydrophobic surface usually provides the potential for a higher effective contact angle after texturing than an intrinsically hydrophilic surface, and generally provides for a higher level of wetting resistance even if the surface texturing becomes less effective over time as the texture wears away.

Relatively little is known about the intrinsic hydrophobicity of broad classes of materials. In general, most of the materials known to have a contact angle with water of greater than 90 degrees are polymers such as tetrafluoroethylene, silanes, waxes, polyethylene, and propylene. Unfortunately, polymers have limitations in temperature and durability that can limit their application, because many practical surfaces that would benefit from low wettability properties are subject in service to high temperatures, erosion, or harsh chemicals.

Ceramic materials are typically superior to polymers in many aspects related to durability. Of the ceramic materials, oxide ceramics are particularly useful because they are highly manufacturable, often have high environmental resistance, and can have good mechanical properties. Unfortunately, there are virtually no known oxide ceramics that are hydrophobic. A notable exception is silicalite, a zeolitic polymorph of $SiO_2$ [E. M. Flanigen, J. M. Bennett, R. W. Grose, J. P. Cohen, R. L. Patton, R. M. Kirchner, and J. V. Smith, "Silicalite, a new hydrophobic crystalline silica molecular sieve," Nature, v. 271, 512 (1978)]. For that material the specific crystal structure is highly important because amorphous $SiO_2$ has a very low, hydrophilic wetting angle. However, the synthesis conditions required to form zeolite crystals can limit the range of applicability of those materials as hydrophobic surfaces and the porosity of zeolite crystals makes them less desirable for applications requiring durability.

Therefore, there remains a need in the art for oxide ceramics that have lower liquid wettability than conventional oxides, promote stable dropwise condensation, are stable at elevated temperatures, are amenable to coating processing, and have good mechanical properties. There is also a need for articles coated with these wetting resistant oxide ceramics.

BRIEF DESCRIPTION

Embodiments of the present invention are provided to meet these and other needs. One embodiment is an article comprising a material that is transparent to electromagnetic radiation of at least one type selected from the group consisting of ultraviolet radiation, visible light, and infrared radiation. The material comprises a primary oxide and a secondary oxide. The primary oxide comprises cerium and hafnium. The secondary oxide comprises a secondary oxide cation selected from the group consisting of the rare earth elements, yttrium, and scandium.

Another embodiment is an article comprising a material that is transparent to electromagnetic radiation of at least one type selected from the group consisting of ultraviolet radiation, visible light, and infrared radiation. The material comprises a primary oxide and a secondary oxide. The primary oxide comprises cerium or hafnium. The secondary oxide comprises (i) praseodymium or ytterbium, and (ii) another cation selected from the group consisting of the rare earth elements, yttrium, and scandium.

Further embodiments include articles and coatings that include any of the materials described herein. As an example, one particular embodiment is an article that comprises a coating having a surface connected porosity content of up to about 5 percent by volume. The coating comprises a material that comprises a primary oxide and a secondary oxide, wherein (i) the primary oxide comprises a cation selected from the group consisting of cerium, praseodymium, terbium, and hafnium, and (ii) the secondary oxide comprises a cation selected from the group consisting of the rare earth elements, yttrium, and scandium. The material is transparent to electromagnetic radiation of at least one type selected from the group consisting of ultraviolet radiation, visible light, and infrared radiation.

Further embodiments include methods for protecting articles. The method includes depositing a coating on a substrate, wherein the coating comprises any of the materials or coatings described herein.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the present invention are based upon the discovery by the inventors of a class of oxide ceramics that shows certain surprising properties. First, they tend to have significantly lower water wettability than commonly known engineering oxides. Some compositions are intrinsically hydrophobic. Moreover, some compositions, even those not intrinsically hydrophobic, have demonstrated the ability to maintain stable dropwise water condensation, making them intriguing candidates for use in heat transfer applications, for instance. Without being bound by theory, it is suspected that this behavior is related to the nature of the oxygen-cation bonding occurring within the crystal structure of the oxide. Finally, certain compositions are transparent to ultraviolet, visible, or infrared radiation, meaning they allow at least about 30% of the incident radiation of at least one wavelength in the spectrum range from infrared through ultraviolet (that is, any wavelength of infrared, visible, or ultraviolet radiation) to transmit through the material. In some embodiments this fraction of transmitted radiation is significantly higher, such as greater than about 50%, and even greater than 70% in particular embodiments. Transparent compositions may allow for wetting-resistant windows and other useful applications, as will be discussed further herein.

Embodiments of the present invention include certain material compositions. Other embodiments include coatings and articles that include these compositions. These compositions may exist in any form, such as, for example, powders, coatings, and ingots. The materials described herein are generally a mixture or a compound of multiple oxides. Throughout this description, the composition of the material may be described in terms of its component oxides, such as, for example, cerium oxide ($CeO_2$) and lanthanum oxide ($La_2O_3$), even if these component oxides are technically not present in the material due to interactions such as phase transformations and chemical reactions. This notation is consistent with that commonly used in the art, where, for example, a compound such as lanthanum cerate may be interchangeably denoted as $La_2O_3.2CeO_2$, $LaO_{1.5}.CeO_2$, or $La_2Ce_2O_7$.

The material used in certain embodiments of the present invention has a cubic crystal structure of the fluorite type. Cerium oxide is an example of a ceramic oxide with this crystal structure. As described below, the present inventors have, in some cases, observed remarkable wetting characteristics for materials having this crystal structure, though it is not assumed at this time that the presence of this crystal structure is a necessary condition to develop such characteristics.

One of the oxides of the material is referred to herein as the "primary oxide." The primary oxide has a cation having at least some tendency to tetravalent behavior. The tetravalent quality of the primary oxide cation is believed to play a role in stabilizing the material in the presence of water. Another of the component oxides of the material is referred to herein as the "secondary oxide." In certain embodiments, the secondary oxide is selected so that it has a lower intrinsic surface energy than the primary oxide. The lower "intrinsic" surface energy generally is manifested by a higher contact angle for a reference liquid (such as, for example, water) on a surface of pure secondary oxide relative to the contact angle for that liquid on a surface of pure primary oxide. Examples of cations whose oxides have shown a surprisingly low surface energy (high reference liquid contact angle) include lanthanum, praseodymium, ytterbium, and neodymium. However, many of the secondary oxides are at least somewhat hygroscopic, making them, when used by themselves, unsuitable for many practical applications involving at least incidental contact with moisture. This limitation was found to be mitigated, as described above, by the addition of primary oxide in accordance with embodiments described herein, which addition appears to stabilize the material in the presence of water and thus presents opportunities for use of the material in practical engineering applications.

It will be appreciated that where materials and articles are described herein as "comprising" or "including" one or more components, the scope of the description includes, without limitation, materials made only of the stated components; materials made of the stated components and including other components that do not materially affect the wettability of the material; and materials including the stated components but not excluding other components. Moreover, where lists of alternatives are provided, the alternatives are not meant to be exclusive; one or more of the alternatives may be selected, except where otherwise explicitly stated.

Figure 1:
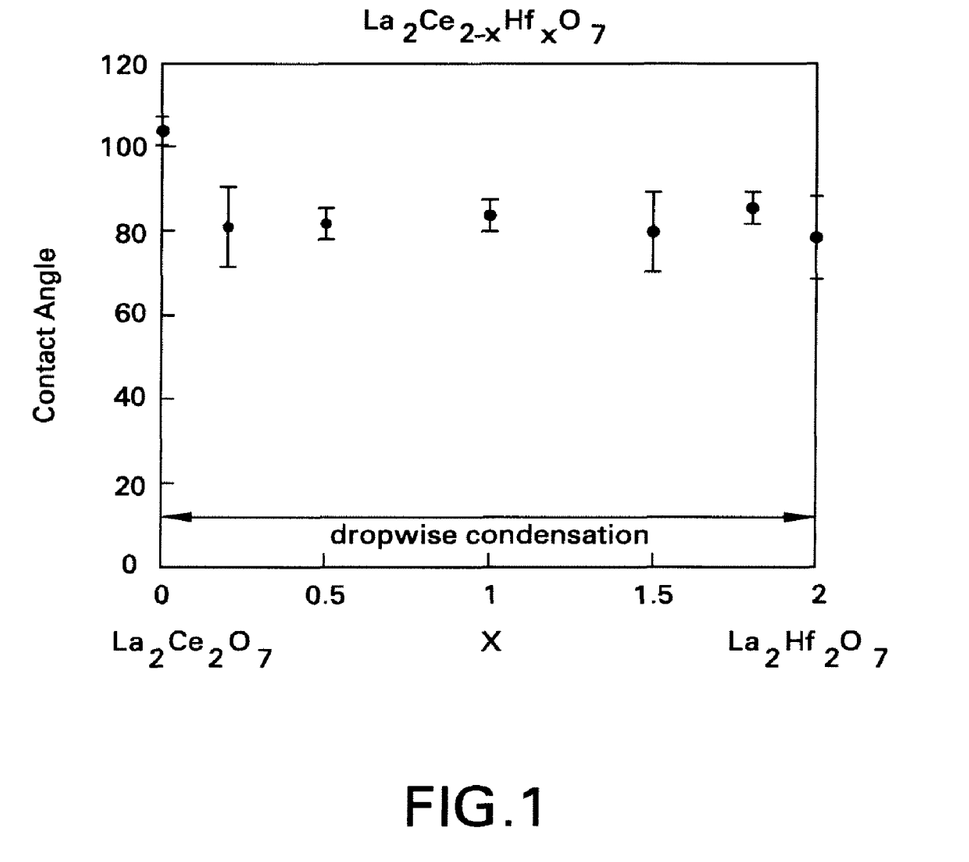
FIG. 1 is a data plot showing static water contact angle as a function of material composition for oxides comprising lanthanum, cerium, and hafnium.

In one embodiment, a material includes a primary oxide that comprises cations ("primary oxide cations") of cerium and hafnium. In some embodiments, a molar ratio of cerium cations to primary oxide cations is in the range from about 0.01 to about 0.99, and in certain embodiments this range is from about 0.1 to about 0.9. The material also includes a secondary oxide that comprises a cation ("secondary oxide cation") selected from the group consisting of the rare earth elements, yttrium, and scandium; in particular embodiments the secondary oxide cation may be lanthanum, praseodymium, ytterbium, or neodymium. In certain embodiments, a molar ratio of the primary oxide cations to total cations present in the material is in the range from about 0.1 to about 0.95; in some embodiments, this range is from about 0.25 to about 0.9; and in particular embodiments, the molar ratio is about 0.5. FIG. 1 demonstrates an example of the performance of such a material, where the secondary oxide was lanthanum oxide, and the primary oxide included cerium and hafnium in various relative proportions, with the overall ratio of primary oxide cations to total cations present in the material was 0.5. Remarkably, although none of the combination materials tested had a contact angle of 90 degrees or greater, all compositions demonstrated dropwise water condensation behavior.

In another embodiment, a material includes a primary oxide comprising a primary oxide cation of cerium or hafnium. In some embodiments, the molar ratio of the primary oxide cations to total cations present in the material is within any of the corresponding ranges provided for the previously described material. The material further includes a secondary oxide that includes (i) a first secondary oxide cation comprising praseodymium or ytterbium, and (ii) a second secondary oxide cation that comprises a rare earth element, yttrium, or scandium. In certain embodiments, a molar ratio of first secondary oxide cations to total secondary oxide cations is in the range from about 0.01 to about 0.99; in certain embodiments this range is from about 0.05 to about 0.95; and in particular embodiments this range is from about 0.1 to about 0.90. In specific embodiments, the secondary oxide comprises praseodymium and lanthanum, and in some embodiments the secondary oxide comprises ytterbium and lanthanum.

Figure 2:
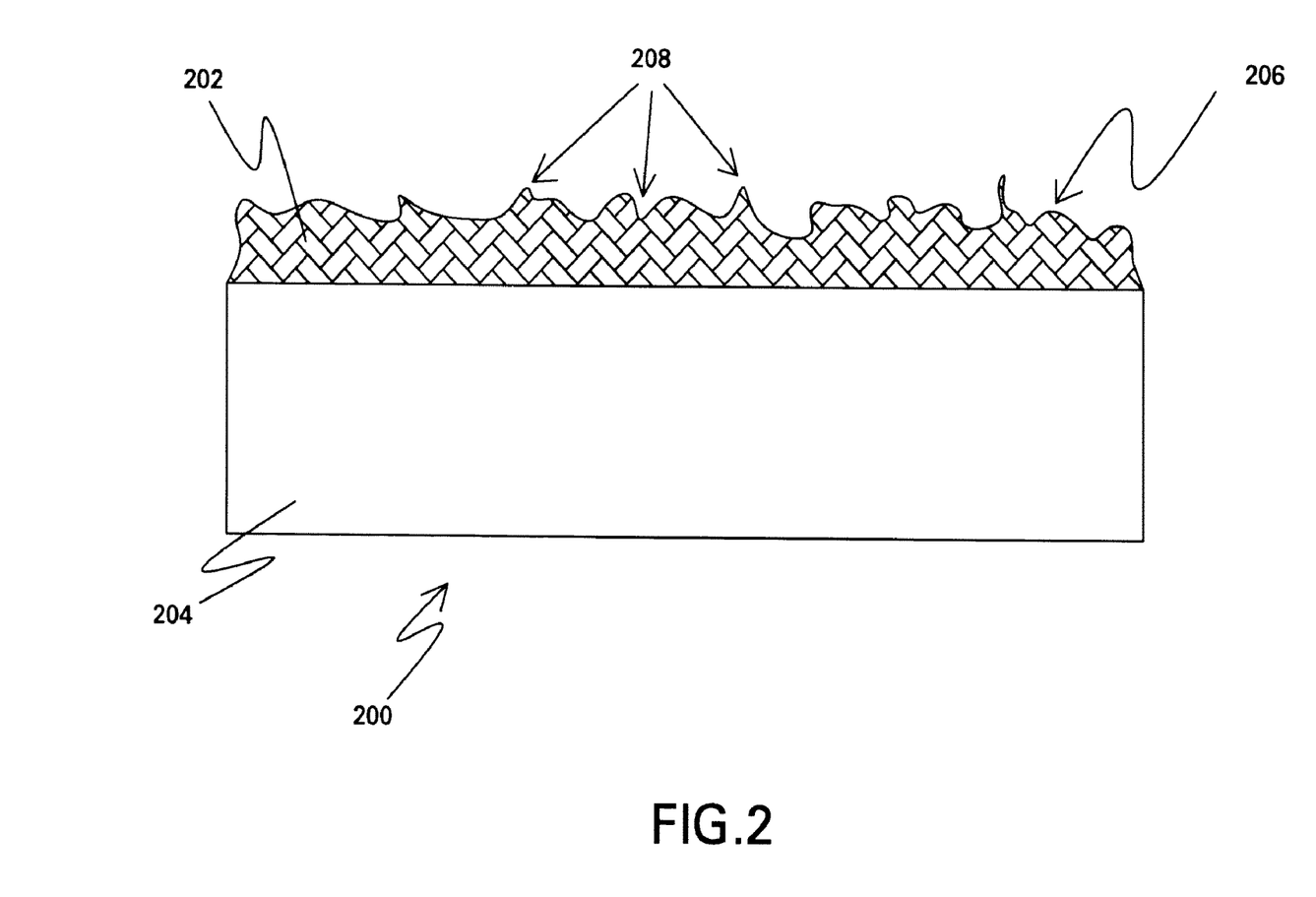
FIG. 2 is a schematic of an exemplary embodiment of the present invention.

Further embodiments of the present invention, as illustrated in FIG. 2, include an article 200 comprising a coating 202, where the coating 202 comprises the materials described herein. In some embodiments, this oxide material ("the material") makes up greater than about 50 percent of the coating volume. In certain embodiments, the material makes up greater than about 75 percent of the coating volume, and in some embodiments the material makes up substantially all of the coating volume (save for incidental impurities and void space). In some embodiments, this coating 202 has a low level of surface connected porosity, such as up to about 5 percent by volume. In certain embodiments, the surface connected porosity is even lower, such as lower than 2 percent, lower than 1 percent, lower than 0.5 percent, or lower than 0.1 percent (all percentages by volume). In some embodiments, the coating 202 is made of material that is substantially theoretically dense. A low content of surface connected porosity may inhibit the absorption of water into a pore network, thereby keeping liquid at the surface of the article. Even a surface made of highly hydrophobic material, for instance, may absorb water if the amount of open porosity is unduly high, thereby rendering the surface ineffective as a barrier to water.

In some embodiments, the article described above further comprises a substrate 204, such as a metal substrate, for example, upon which the aforementioned coating 202 is disposed. Examples of metal substrates include metals and alloys made with aluminum, steel, stainless steel, nickel, copper, or titanium. In particular, common engineering alloys such as 306 stainless steel, 316 stainless steel, 403 stainless steel, 422 stainless steel, Custom 450 stainless steel, commercially pure titanium, Ti-4V-6Al, and 70Cu-30Ni are suitable substrates.

Various intermediate coatings (not shown) may be applied for any reason, such as to achieve desired levels of adhesion between substrate and coating, depending on the nature of the materials involved and the selected methods for processing the materials. Such variations generally are within the knowledge of one skilled in the art. Thickness of the coating will depend upon the nature of the environment and the application envisioned for the article. For example, in a heat exchanger application, the coating is typically designed to minimize thermal resistance between the environment and the substrate while achieving a practical service lifetime. Determination of the coating thickness for a given application is within the knowledge of one skilled in the art.

In some embodiments the material, whether embodied in a coating or freestanding object, has a low level of overall porosity, such as lower than about 5 percent by volume. In certain embodiments, the overall porosity of the material is even lower, such as lower than about 1 percent. In some embodiments, the material is substantially theoretically dense throughout. The overall porosity of the material, like the thickness of the coating described above, plays a role in determining the thermal resistance of the article: higher porosity typically results in high thermal resistance. Thus, maintaining a low overall porosity may be important in embodiments where low thermal resistance is desirable.

Any manufacturing method useful for fabrication and/or deposition of ceramic oxide materials may be used for fabricating the materials and articles described herein. Accordingly, embodiments of the present invention include a method for protecting an article from a liquid-containing environment, comprising applying a coating 202 to a substrate 204, where the coating 202 comprises any of the materials or coatings described herein. Examples of well-known processes capable of making ceramic oxide materials include powder processing, sol-gel processing, chemical vapor deposition and physical vapor deposition. In powder processing methods, a ceramic article is formed from ceramic particles using a method such as pressing, tape casting, tape calendaring or screen printing, and then consolidating and densifying the powders using a sintering process. Sol-gel processing methods provide a ceramic precursor in liquid form to a substrate after which the ceramic material is substantially formed through chemical reactions such as hyrdrolyzation and polymerization, and subsequently heat treated to produce and densify the ceramic material. Chemical vapor deposition methods involve providing gaseous precursor molecules to a heated substrate to form a ceramic article and include atmospheric pressure chemical vapor deposition, low-pressure chemical vapor deposition, metal-organic chemical vapor deposition and plasma enhanced chemical vapor deposition. Physical vapor deposition processes produce a vapor of material from solid precursors and supply the vapor to a substrate to form a ceramic article. Physical vapor deposition processes include sputtering, evaporation, and laser deposition. In the case of bulk ceramic articles, the substrate is used to form the ceramic body in the form of a crucible, die or mandrel and subsequently removed. In the case of ceramic coatings, the ceramic article remains attached to the substrate. The processing methods can be selected and tailored by a practitioner skilled in the art to produce the desired control of chemical composition and density of the ceramic oxide articles.

In some embodiments, the surface of the material, e.g. a coating 202, further comprises a surface texture 206 to further improve the wetting-resistant properties of the article. A surface texture 206 comprises features 208 disposed at the surface; examples of such features include, without limitation, elevations (such as cylindrical posts, rectangular prisms, pyramidal prisms, dendrites, nanorods, nanotubes, particle fragments, abrasion marks, and the like); and depressions (such as holes, wells, and the like). In some embodiments, the surface texture serves to increase the tortuosity of the surface, which increases the contact angle of a hydrophobic material. In other embodiments, the features are sized and configured to create pockets of air between a drop of liquid and the surface, which can reduce the effective surface energy and produce a higher contact angle than would be expected for a smooth surface. Examples of such textures and methods for generating them are described in commonly owned U.S. patent application Ser. Nos. 11/497,096; 11/487,023; and 11/497,720; which are incorporated by reference herein in their entireties.

One particular embodiment of the present invention is an article 200. The article comprises a coating 202 that has the low level of surface porosity as described previously. This coating 202 comprises a material that includes primary and secondary oxides. In some embodiments, the material is any of those described above. In another embodiment, the primary oxide comprises a cation selected from the group consisting of cerium, praseodymium, terbium, and hafnium; and the secondary oxide, which, as described previously, has a lower intrinsic surface energy than the primary oxide, comprises a cation selected from the group consisting of the rare earth elements, yttrium, and scandium. In particular embodiments, the primary oxide comprises a cation selected from the group consisting of cerium and hafnium. Moreover, in some embodiments the secondary oxide cation includes lanthanum, praseodymium, or neodymium. The descriptions above regarding embodiments that include substrates coated with the material, or the use of textured surfaces 206, are also applicable for this embodiment.

Figure 3:
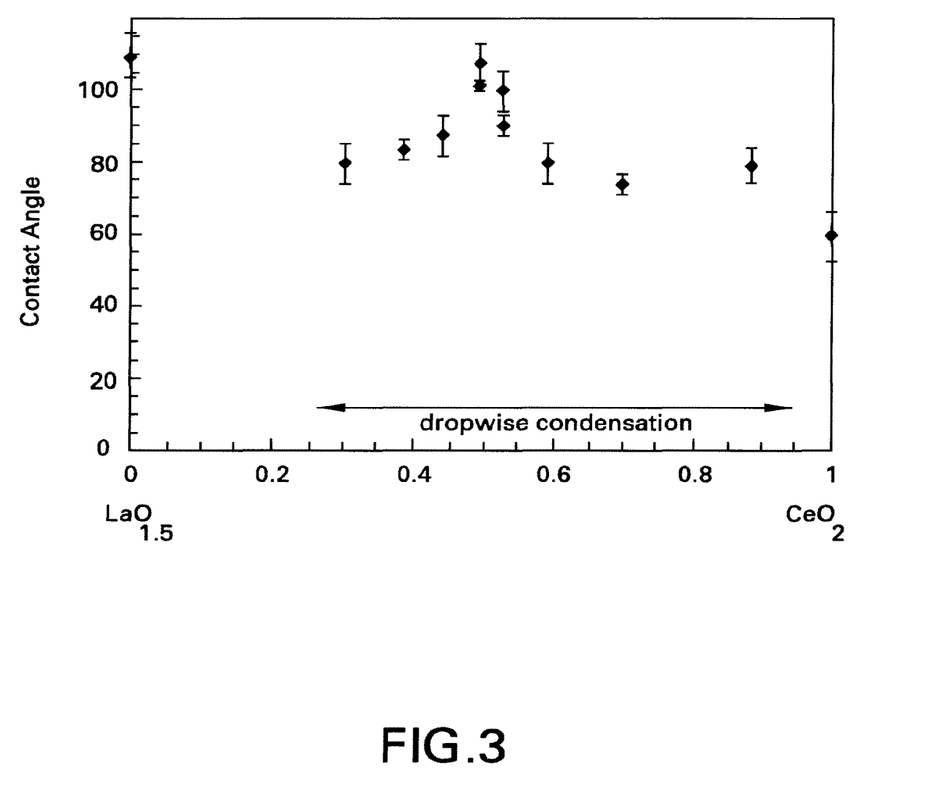
FIG. 3 data plot showing static water contact angle as a function of material composition for oxides comprising cerium and lanthanum.

In one set of embodiments, the primary oxide comprises cerium oxide. Cerium oxide may be combined with a secondary oxide to form a stable oxide material having desirable properties as described above. In one example, the secondary oxide comprises lanthanum oxide. In certain embodiments using this lanthanum-bearing material, the cerium cation makes up at least about 25 molar percent of the cations present in the material; and in particular embodiments cerium cation makes from about 45 molar percent to about 55 molar percent of the cations present in the material. FIG. 3 shows contact angle measurements made for a range of binary combinations of cerium oxide and lanthanum oxide. Remarkably, all compositions tested produced stable dropwise water condensation, while pure cerium oxide produced filmwise condensation.

Figure 4:
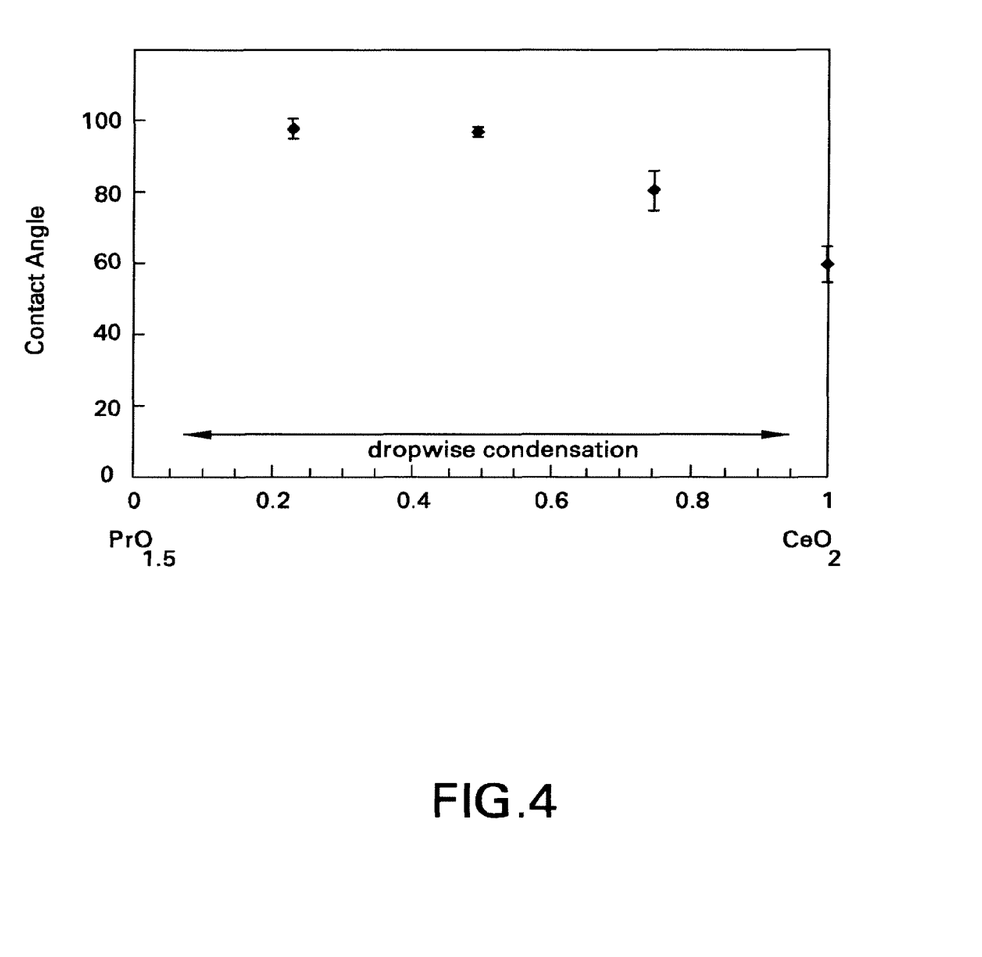
FIG. 4 is a data plot showing static water contact angle as a function of material composition for oxides comprising cerium and praseodymium.

In another example, the primary oxide comprises cerium oxide, and the secondary oxide comprises praseodymium oxide. In certain embodiments, cerium cation makes up at least about 7 molar percent of the cations present in the material. In particular embodiments cerium cation makes up a molar percentage of the cations present in the material in the range from about 7 percent to about 60 percent, in which range the highest water contact angles were observed. FIG. 4 shows contact angle measurements made for a range of binary combinations of cerium oxide and praseodymium oxide. Again, despite the fact that cerium oxide itself produced filmwise water condensation, all of the cerium oxide/praseodymium oxide combination materials tested surprisingly produced stable dropwise condensation.

Figure 5:
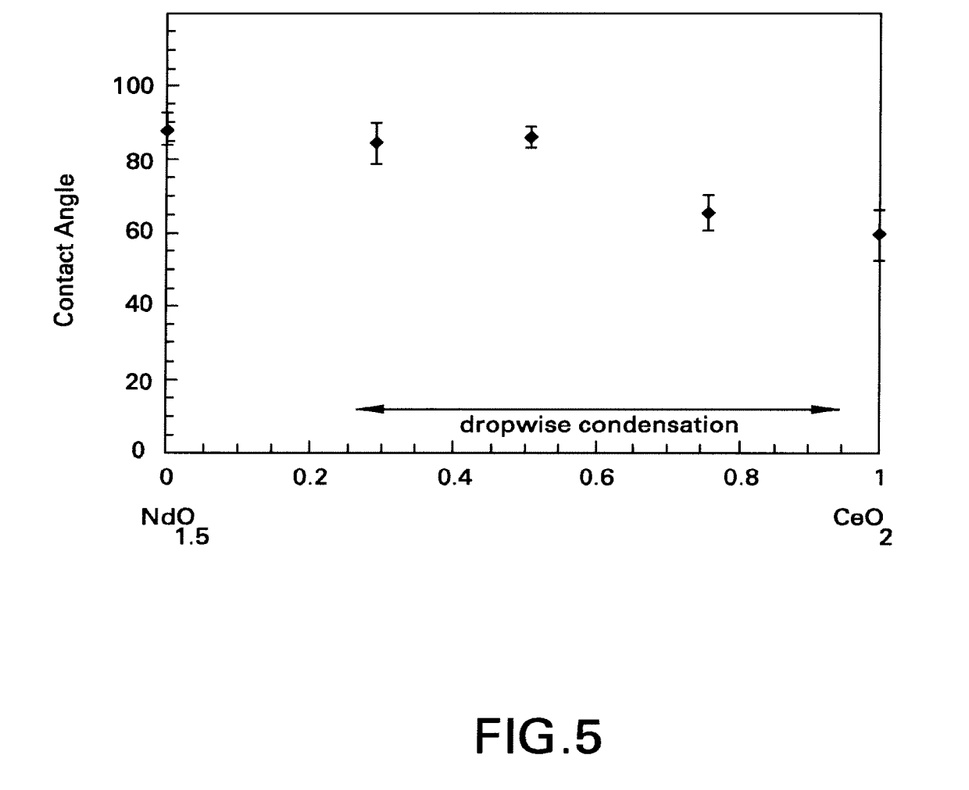
FIG. 5 is a data plot showing static water contact angle as a function of material composition for oxides comprising cerium and neodymium.

In another example, the primary oxide comprises cerium oxide, and the secondary oxide comprises neodymium oxide. In certain embodiments, the cerium cation makes up at least about 20 molar percent of the cations present in the material. In particular embodiments cerium cation makes up a molar percentage of the cations present in the material in the range from about 20 percent to about 60 percent, in which range the highest water contact angles were observed. FIG. 5 shows contact angle measurements made for a range of binary combinations of cerium oxide and neodymium oxide. Again, surprisingly, all of the neodymium oxide/cerium oxide combination materials tested produced dropwise water condensation.

Although certain examples described above highlighted materials made of binary combinations of a single primary oxide with a single secondary oxide, it will be appreciated that embodiments of the present invention include those in which one or both of the primary oxide and the secondary oxide are made up of more than one oxide component. For example, in some embodiments the primary oxide comprises more than one oxide, and each of these oxides is an oxide that includes as a cation cerium, praseodymium, terbium, or hafnium. In one example, the molar ratio of primary oxide cation to secondary oxide cation is about 1, meaning that the material comprises an equal mole fraction of primary oxide cation and secondary oxide cation. For instance, the material may have a composition denoted by the formula $S_2Z_{2-x}Z'_xO_{7+/-y}$, where S denotes all cations (be it one cation species or more than one) of the secondary oxide, Z and Z' respectively denote a cation of the primary oxide, y is a number less than 1, and x is a number in the range from about 0.01 to about 1.99. Here, the molar fraction of secondary oxide cation is equivalent to the mole fraction of primary oxide cation—both have a value of 2 moles of cation per mole of material. The value of y is dependent upon the tendency of the cations towards tetravalent states vs. trivalent states and will vary as required by charge balancing. As discussed previously, FIG. 1 demonstrates an example of the performance of such a material, where S denotes lanthanum, Z is cerium, and Z' is hafnium.

Thermal barrier coatings made of cerates, such as lanthanum cerate, and hafnates, such as lanthanum hafnate ($La_2Hf_2O_7$) are known in the art. See, for example, U.S. Pat. Nos. 6,835,465 and 6,387,526. Although the compositions used for these coatings are similar to some of those described above, the coatings described in the art have markedly different wetting resistance properties compared to the materials and articles described herein. Thermal barrier coatings are generally applied using thermal spray techniques or physical vapor techniques, both of which are known to produce coatings having relatively high levels of porosity. Typical industrial thermal barrier coatings have porosity in the range from about 10 percent to about 25 percent, and researchers have shown that thermal barrier coatings made with lanthanum cerate, for example, exhibit these typical porosity levels (see, for example, Cao et. al, *Advanced Materials*, vol 15. issue 17, pp 1438-1442 (2003)). The porosity is generally thought to provide an advantage in these applications in that it may enhance the thermal resistance and strain compliance of the coating. For instance, it is well documented that the strain compliance necessary for thermal cycling of thermal barrier coatings requires significant amounts of porosity to be incorporated into the coatings, in the form of intercolumnar gaps in EB-PVD coatings and porosity between splats in thermal spray coatings. The distribution and morphology of coatings deposited by both processes has been studied extensively to understand the enhancement in thermal resistance in the coatings as well as the detrimental effects on thermal and mechanical properties caused by the sintering loss of the porosity. Such work has determined that sintering of the coating results in a decrease in porosity and increase in Young's modulus, thereby resulting in higher thermally induced stresses and a decrease in thermal fatigue lifetime of the thermal barrier coating. For these reasons, thermal barrier coatings generally are structured to maintain a high level of porosity over long lifetimes at elevated temperatures.

In stark contrast to thermal barrier coatings, however, the oxides applied in certain embodiments of the present invention are significantly more dense, because their primary function is not to inhibit heat transfer to the substrate, but to inhibit buildup of liquids, ice, or other foreign matter at the coating surface. The high porosity levels described in the thermal barrier coating arts generally would not be suitable for use in many embodiments of the present invention. In fact, as noted above, in many heat transfer applications the material is designed to minimize thermal resistance, which typically would require achieving porosity levels that are as low as practically attainable.

Figure 6:
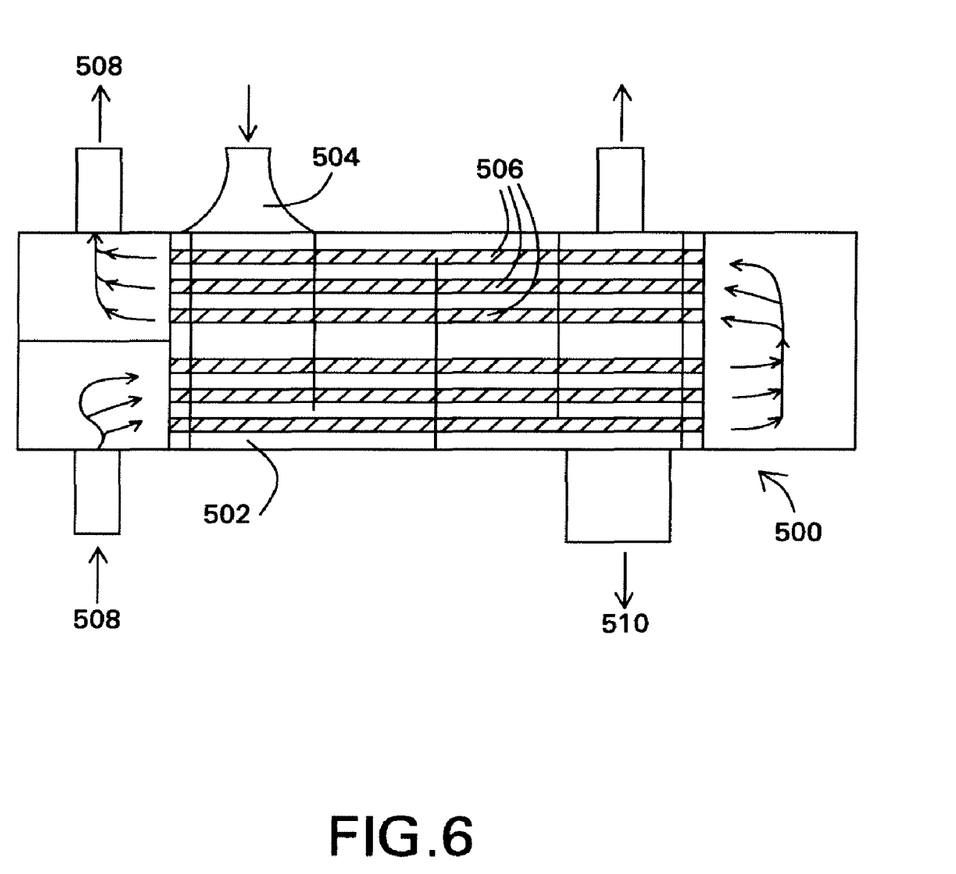
FIG. 6 is a schematic of an exemplary embodiment of the present invention.

The novel properties described for the above embodiments lend themselves to a host of useful applications where resistance to wetting by liquids is desirable. A condenser used, for instance, to transfer heat between a hot vapor and a cooling fluid, such as is used in chemical processing, water desalination, and power generation, is an example of an embodiment of the present invention using the articles and materials described above. FIG. 6 illustrates one common type of condenser: the surface condenser 500. Steam, for example, enters shell 502 through inlet 504, whereupon it is condensed to water on the exterior surface of condensation tubes 506, through which flows a cooling fluid 508, such as water. The material (not shown) described above is disposed on this exterior surface of the condensation tubes 506, thereby promoting dropwise condensation of condensate water from the steam. The condensate is easily shed from the tubes 506 by the material and exits from shell 502 via condensate outlet 510.

In certain applications, such as, for example, steam turbines, metal components are subject to impinging drops of water as well as condensing drops. As steam expands in a turbine, water droplets (typically fog-sized) appear in the flow stream. These droplets agglomerate on the turbine blades and other components and shed off as larger drops that can cause thermodynamic, aerodynamic, and erosion losses in turbines. The ability to shed water droplets from components before they have a chance to agglomerate into substantially larger drops is thus important to maximize system lifetime and operation efficiency. As noted above, many of the compositions applied in embodiments of the present invention promote dropwise condensation, so that liquid is shed from the surface in small drops rather than in larger sheets. Accordingly, embodiments of the present invention include a steam turbine assembly comprising the article described above. In particular embodiments, the article is a component of a steam turbine assembly, such as a turbine blade, a turbine vane, or other component susceptible to impingement of water droplets during turbine operation.

Certain embodiments of the present invention may reduce the formation, adhesion, and/or accumulation of ice on surfaces. Icing takes place when a water droplet (sometimes supercooled) impinges upon the surface of an article, such as an aircraft component or a component of a turbine assembly (for example, a gas or wind turbine), and freezes on the surface. The build-up of ice on aircraft, turbine components, and other equipment exposed to the weather, increases safety risks and generates costs for periodic ice removal operations. Certain embodiments of the present invention include an aircraft that comprises the articles and materials described above; a component of such an aircraft suitable to serve as the embodied article may include, for example, a wing, tail, fuselage, or an aircraft engine component. Non-limiting examples of aircraft engine components that are suitable as articles in embodiments of the present invention include the nacelle inlet lip, splitter leading edge, booster inlet guide vanes, fan outlet guide vanes, sensors and/or their shields, and fan blades.

Icing is a significant problem for wind turbines, as the build-up of ice on various components such as anemometers and turbine blades reduces the efficiency and increases the safety risks of wind turbine operations. Wind turbine blades and other components are often made of lightweight composite materials such as fiberglass in order to save weight, and the build-up of ice can deleteriously load the blades to a point that significantly reduces their effectiveness. In certain embodiments of the present invention, an article as described above is a component, such as a turbine blade, anemometer, gearbox, or other component, of a wind turbine assembly.

As other components exposed to the weather are also adversely affected by ice and/or water accumulation, other embodiments may include, for instance, components of other items exposed to the weather, such as power lines and antennas. The ability to resist wetting may benefit a host of components that are so exposed, and the examples presented herein should not be read as limiting embodiments of the present invention to only those named applications.

One particularly useful potential application for some of the materials described herein include applications involving the transmission of electromagnetic radiation, especially infrared (IR), visible, and/or ultraviolet (UV) radiation. Those skilled in the art will appreciate that many of the oxides described herein are made of components, such as ytterbium oxide, for instance, that readily transmit radiation over significant portions of the visible and near visible (IR and UV) spectrum. Transparent oxides may be formed according to the methods described herein by controlling the composition and microstructure of the oxides. For example, where transparency is desired for a specified wavelength range, component oxides may be selected that do not substantially absorb in that range, and the material is then processed according to known methods to minimize defects that would scatter incident radiation. The transparent material may be disposed as a coating on a substrate, or may be a monolithic material. In particular embodiments of the articles described previously, the article comprises a material that is transparent to electromagnetic radiation of at least one type selected from the group consisting of ultraviolet radiation, visible light, and infrared radiation. In particular embodiments, the substrate is coated with such a material, and this substrate comprises a material that is also transparent to the radiation. One example of a potentially useful application of the transparent material described above includes photovoltaic devices. Another example is a window of any type. Here "window" embraces any component designed to allow at least some incident visible or near visible radiation to transmit; examples include, but are not limited to, windows for buildings, windshields for vehicles, and components of sensors designed to sense or emit certain wavelengths of radiation. The hydrophobic and/or dropwise condensation-promoting properties of the transparent materials described herein allow the potential for windows and the like that easily shed dirt and water that may otherwise foul the surface and detract from performance.

EXAMPLE

Without further elaboration, it is believed that one skilled in the art can, using the description herein, utilize the present invention to its fullest extent. The following example is included to provide additional guidance to those skilled in the art in practicing the claimed invention. The example provided is merely representative of the work that contributes to the teaching of the present application. Accordingly, this example is not intended to limit the invention, as defined in the appended claims, in any manner.

A coating in accordance with embodiments described herein was deposited on a commercially pure titanium substrate by radio frequency magnetron sputtering. The sputtering target was produced by pressing and sintering a mixture of primary oxide, here cerium oxide, and secondary oxide, here lanthanum oxide, where the molar ratio of primary oxide cations to the total cations present was about 0.5. A coating with a thickness of about 300 nm was produced using a deposition rate of 49 Å/min at a forward power of 100 watts in a 7% oxygen/93% argon gas mixture. The contact angle with water for the coating was about 113 degrees. The coating exhibited dropwise condensation in steam.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An article, comprising:
   a coating comprising a material, wherein the material comprises
   (i) a primary oxide comprising a cerium cation, and
   (ii) a secondary oxide comprising a cation selected from the group consisting of praseodymium and neodymium;
   wherein the material is transparent to electromagnetic radiation of at least one type selected from the group consisting of ultraviolet radiation, visible light, and infrared radiation;
   wherein substantially all of the material within the article has an overall porosity of lower than about 5 percent by volume.

2. The article of claim 1, wherein the material makes up at least about 50 percent by volume of the coating.

3. The article of claim 1, wherein the coating further comprises a surface texture.

4. The article of claim 1, wherein the secondary oxide comprises praseodymium oxide.

5. The article of claim 4, wherein cerium cation makes up at least about 7 molar percent of the cations present in the material.

6. The article of claim 5, wherein cerium cation makes up a molar percentage of the cations present in the material in the range from about 7 percent to about 60 percent.

7. The article of claim 1, wherein the secondary oxide comprises neodymium oxide.

8. The article of claim 7, wherein cerium cation makes up at least about 20 molar percent of the cations present in the material.

9. The article of claim 8, wherein cerium cation makes up a molar percentage of the cations present in the material in the range from about 20 percent to about 50 percent.

10. The article of claim 1, wherein the primary oxide further comprises praseodymium, terbium, or hafnium cation.

11. The article of claim 10, wherein a ratio of primary oxide cation molar fraction to secondary oxide cation molar fraction is about 1.

12. The article of claim 11, wherein the material has a composition described by the chemical formula $S_2Z_{2-x}Z'_xO_{7+/-y}$, where S denotes all cations of the secondary oxide, Z and Z' respectively denote a cation of the primary oxide, y is a number less than 1, and x is a number in the range from about 0.01 to about 1.99.

13. The article of claim 1, wherein the coating is disposed on a substrate, and the substrate comprises a material that is transparent to the electromagnetic radiation.

14. The article of claim 1, wherein the article is a photovoltaic device.

15. The article of claim 1, wherein the article is a window.

16. The article of claim 1, wherein the article is a sensor.

17. The article of claim 1, wherein the material is transparent to visible light.

18. The article of claim 1, wherein substantially all of the material within the article has an overall porosity of lower than about 1 percent by volume.

* * * * *